May 11, 1965 C. R. ZOLNIK 3,183,451

SATURABLE MULTI-MODE OSCILLATOR

Filed Aug. 27, 1962

INVENTOR.
CHARLES R. ZOLNIK
BY
ATTORNEY

United States Patent Office 3,183,451
Patented May 11, 1965

3,183,451
SATURABLE MULTI-MODE OSCILLATOR

Charles R. Zolnik, Plainview, N.Y., assignor to Sperry Rand Corporation, Great Neck, N.Y., a corporation of Delaware Filed Aug. 27, 1962, Ser. No. 219,490
8 Claims. (Cl. 331—78)

Figure 1:
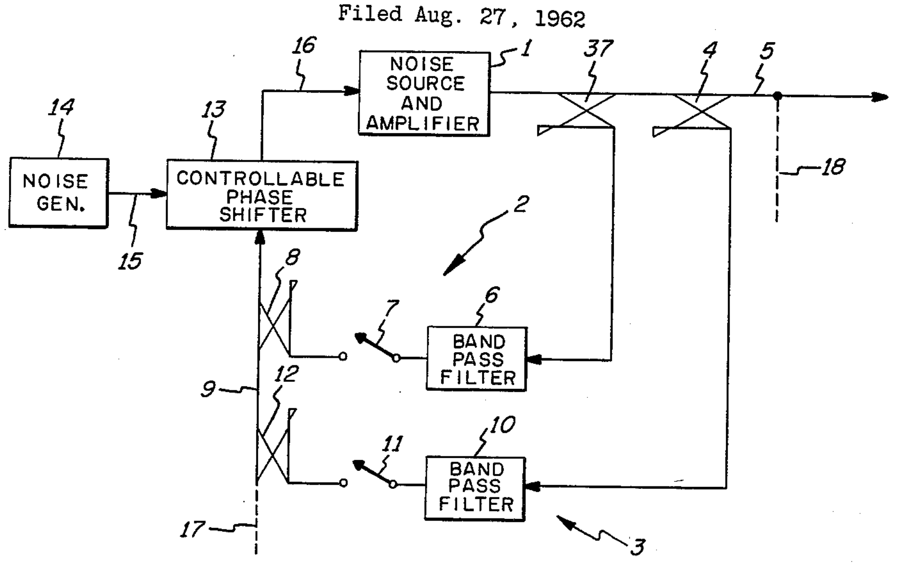

The present invention relates generally to signal generators and, more particularly, is concerned with efficient means for producing a plurality of simultaneous frequencies which are not necessarily integrally related.

In certain applications such as in signal receiver jammers, it is desirable to produce signals of many different frequencies simultaneously. Multi-frequency oscillators have been proposed in the art for such purposes but fall short of realizing all of the characteristics required of optimum devices. One known technique proposes a multi-loop oscillator comprising a plurality of feedback channels and a single broad band signal amplifier common to all loops. For each closed loop the classical criteria of oscillation must be satisfied if a signal is to be sustained in the loop without external driving. That is, for each frequency sustained, there must exist a loop whose equivalent electrical length is an integral number of wavelengths of that frequency. It is also necessary that the closed loop gain at the oscillatory frequency be unity.

In a practical system, all loop gains are set slightly in excess of unity to allow for circuit parameter variations. This excess gain, or gain margin, gives rise initially to oscillatory expansion, i.e., the amplitude of the oscillation continuously increases with each recirculation. This build-up is eventually checked by the onset of non-linear amplifier operation, at which point the loop gain degenerates toward unity. The non-linearity of the oscillatory system gives rise to a substantial problem. In particular, there is an interaction between the polarity of signals being recirculated through the amplifier causing all other frequencies to be suppressed by the frequency with the largest gain margin and therefore, largest build-up rate.

One proposed solution to this problem avoids frequency capture by the provision of individual signal limiting means in each of the amplifier feedback channels. The amplitude limiter maintains the total signal amplitude at the input of the amplifier below that level at which non-linear amplifier operation takes place. A major disadvantage of the amplitude limiting technique follows from the fact that amplifiers produce considerably more power output when operating in their non-linear regions. The signal limiting technique avoids the problem of amplifier capture but only at the expense of reduced oscillator efficiency.

A solution to the efficiency problem is presented in co-pending patent application Serial Number 152,883, filed in the name of Karl Ries and John E. Zellers on November 16, 1961 and assigned to the assignee of the present invention. When certain special operating conditions are satisfied in accordance with said co-pending application, a plurality of signal frequencies may be produced in an efficient manner involving amplifier saturation. No signal amplitude limiting means are necessary. However, it has been found that the plurality of simultaneously generated signal frequencies must lie within a band of frequencies not less than approximately 50 megacycles in order to avoid the need for inordinately high amplifier gains. Moreover, the amplitudes of each of the simultaneously produced signals are to a degree unequal whereby the available amplifier power is not distributed equally between the various generated signal frequencies. Thus, although the technique presented in the co-pending application represents a useful solution to the problem of efficiently producing a simultaneous multiplicity of signal frequencies especially where structural simplicity is an important consideration, other applications remain which require the concentration of available amplifier power in multiple or narrower frequency spectrums and a more even distribution of available amplifier power between the generated frequency components.

It is a principal objejct of the present invention to provide a saturable multi-mode oscillator characterized by efficiency and flexibility of operation.

Another object is to provide a saturable multi-mode oscillator characterized by flexibility of operating bandwidth and an equalized power distribution between the generated frequencies.

A further object is to provide a saturable multi-mode oscillator adaptable for operation over controllable ranges of microwave frequencies.

These and other objects of the present invention, as will appear from a reading of the following specification, are achieved in a typical microwave embodiment by the provision of a plurality of closed oscillatory loops comprising a noise-actuated phase shifter connected in tandem with a broadband travelling wave tube amplifier and a plurality of feedback channels coupled across the tandemly connected phase shifter and amplifier. The amplifier may also function as a source of noise signals. Each feedback channel includes a bandpass filter to select the desired modes from the plurality of modes available in each feedback loop.

The gain margin and the signal recirculation time through each of the closed oscillatory loops determines the signal "build-up" time in that loop, i.e., the time period required for a recirculating signal component to be amplified from its initially low noise level to that higher level which drives the amplifier into a saturation condition. Signal build-up, of course, occurs only at those signal frequencies for which the loop is an integral number of wavelengths long. Therefore, the frequencies at which build-up occurs are determined by and may be varied with the setting of the aforementioned phase shifter. More particularly, the amount of time that the amplitude of a given recirculating signal continues to increase depends upon how long the phase shifter "dwells" at that setting which makes the oscillatory loop an integral member of wavelengths at which the frequency of said recirculating signal.

If the modulation rate (rate at which the phase shifter is driven) is small compared to the loop traversal time, the effective loop length will not have changed significantly from one recirculation to the next. The result is that the oscillation frequency will remain substantially constant for a number of recirculations allowing sufficient time for the "capture" effect. In accordance with the present invention, however, the phase shifter is continuously driven at a rate which is of the order of the recirculation rate whereby the loop supports a number of different frequencies. This maintains the oscillations in a transient state precluding the possibility of "capture" of any one frequency. A multiplicity of signals are sustained simultaneously.

Figures 2, 3:
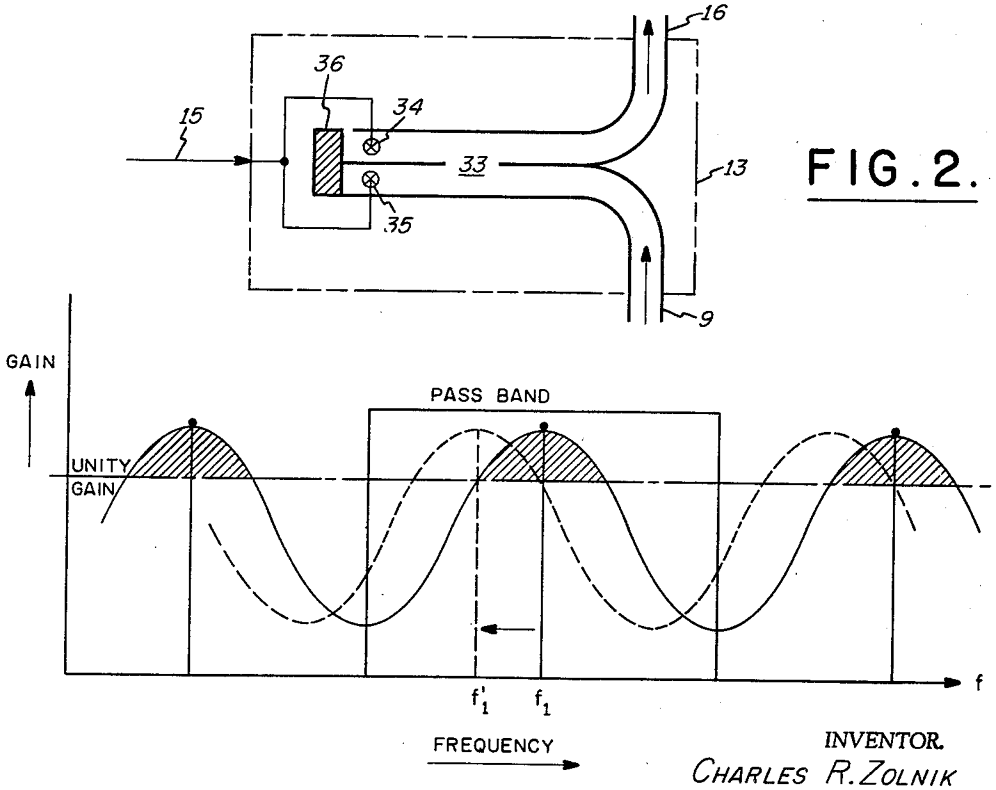

For a more complete understanding of the present invention reference should be had to the following specification and to the figures of which:

FIG. 1 is a simplified block diagram of a typical embodiment of the present invention adapted for operation at microwave frequencies, FIG. 2 is a simplified representation of an actuable phase shifter useful in the embodiment of FIG. 1; and FIG. 3 is an idealized plot in terms of gain versus frequency of the regenerated signals produced by the embodiment of FIG. 1.

The saturable multi-mode oscillator represented in FIG. 1 is adapted for operation over a broad range of microwave frequencies. The oscillator comprises a forward signal channel including noise source and amplifier 1 and a plurality of signal feedback channels typified by feedback channels 2 and 3. Each of the feedback channels is coupled at its input by a respective directional coupler such as couplers 37 and 4. Typical feedback channel 2 includes band pass filter 6 and switch 7 and is coupled by directional coupler 8 to a common feedback line 9. Channel 3, comprising band pass filter 10 and switch 11, is similarly coupled by directional coupler 12 to feedback line 9. Feedback line 9 is connected to the signal input of controllable phase shifter 13 which is also adapted to receive an actuating signal from noise generator 14 via line 15. Phase shifter 13 introduces amounts of phase shift in the signal appearing on feedback line 9 in accordance with the amplitude of the oscillatory signal applied via line 15. The phase shifted microwave signal is applied by line 16 to amplifier 1 thereby closing a plurality of oscillatory loop comprising amplifier 1, phase shifter 13 and respective ones of the feedback channels 2 and 3.

Although two feedback channels are shown in FIG. 1 for the sake of exemplification, it will be recognized that a larger number of feedback channels, each with its own band pass filter may be added as suggested by dashed lines 17 and 18. The purpose of the individual feedback channels is to allow for selectively frequency quantizing the signals generated by the saturable multi-mode oscillator within the broad operating frequency range of amplifier 1 which may be a travelling wave tube amplifier.

As is well known, a travelling wave tube amplifier, such as amplifier 1, is characterized by the production of low level noise-like signals over a broad range of frequencies. Thus, the travelling wave tube fulfills the designated function of a noise source and an amplifier. If desired, however, a separate noise source may be coupled to introduce noise-like signals into the oscillatory loops. Directional couplers 37, 4, 8 and 12 may introduce an attenuation of approximately 15 db each in a representative case. Each of the band pass filters 6 and 10 typically introduce several more db of attenuation. It is necessary, of course, that amplifier 1 introduce a signal gain exceeding the sum of the signal attenuations of the individual feedback channels so that oscillation may be sustained around each regenerative oscillatory loop.

Each of the feedback channels preferably are designed to have an electrical length such that the signal recirculation period is many times greater than the oscillatory period of a respective fundamental frequency signal. The required electrical length may be achieved by the addition of a lumped delay element in each of the feedback channels. Inasmuch as the electrical length of each feedback channel is many times greater than the wave lengths of its fundamental frequencies, many harmonics thereof would be sustained in each of the feedback channels. The band pass filter of each feedback channel is tuned to pass one of the harmonically related frequencies to the exclusion of the others.

The purpose of controllable phase shifter 13 is to change simultaneously the electrical lengths of all of the feedback channels whereby the frequencies of each of the regenerated oscillations are continuously varied. In accordance with the present invention, the rates at which the frequencies of the regenerated signals are varied are made fast enough to preclude the capture of the amplifier by any one signal frequency. In other words, the action of the phase shifter 13 is such that each of the regenerated signals is favored in turn by optimum conditions of regeneration for brief periods of successive times which recur at a rate sufficient to prevent any substantial degree of decay of a given signal during the time that another signal is being favored. The result is that each of the regenerated signals is permitted to build up to an average level which drives the travelling wave tube amplifier into its saturation condition.

The operation described above will be seen more clearly by reference to FIG. 3. Referring to FIG. 3, a typical gain vs. frequency characteristic associated with one of the feedback channels is shown for a given setting of controllable phase shifter 13. The spacing of the peaks is determined by the equivalent electrical loop length through that channel and is equal to the frequency for which the loop is one wavelength long. An ideal filter passband has been drawn about one of the peaks. Only the frequencies within this pass band will have the possibility for regeneration in the loop.

As oscillatory buildup is initiated with the closing of the loop, all frequencies within the band will begin circulating around the loop. The frequencies below the unity gain line will degenerate after a few recirculations. All those frequencies above the line, save for the center peak frequency, will eventually decay also, due to their improper phase characteristic. That is, all the frequencies above the unity gain line satisfy the gain criterion for oscillation. However, only the center frequency, for which the loop is an integral number of wavelengths long, will satisfy the phase criterion. Thus, eventually only this frequency will be present in the loop.

When modulation is applied to the loop the positions of the peaks in FIG. 3 are shifted in frequency. Thus the original oscillation frequency $f_1$ shifts in a time $\Delta t$, to $f_1'$. Shifting also occurs simultaneously in the peaks of the other system loops. As previously discussed, the present invention avoids the capture effect by shifting the oscillatory frequencies back and forth throughout their respective bands at a rate sufficient to maintain the oscillator in a transient condition.

FIG. 2 represents a suitable controllable phase shifter 13 which may be used in the saturable multi-mode oscillater of FIG. 1 for varying the effective electrical length of each of the regenerative feedback loops. Shifter 13 comprises, in the illustrative case, a hybrid junction 33 having input arm 9 and output arm 16 connected in the microwave circuit as shown in FIG. 1. The phase shifter further comprises a pair of variable reactance diodes 34 and 35 which are jointly excited by amplitude varying noise-like signals applied via input line 15. Junction 33 is terminated by a reflecting load 36. In operation, diodes 34 and 35 introduce a reactive load in the respective waveguides intermediate junction 33 and reflector 36 depending upon the amplitude of the applied noise-like signal. The resulting noise-like variation of waveguide reactance changes the effective electrical length of the waveguides intermediate junction 33 and reflector 36 so that the phase shift suffered by the microwave input signal applied to line 9 in reaching output line 16 also varies in a noise-like manner. The result is that controllable phase shifter 13, in combination with noise generator 14 simultaneously introduces a varying phase shift into all of the feedback channels operating in conjunction with amplifier 1.

It should be observed that the required varying phase shift may be produced without necessarily requiring the provision of an independent structural element such as phase shifter 13. Alternatively, the output signal provided by noise generator 14 may be applied to vary the electron beam potential of the travelling wave tube amplifier comprising noise source and amplifier 1. Another technique is to vary the tuning of the individual band pass filters associated with the respective feedback channels by application of a signal provided by noise generator 14 to variable reactance elements which may be included within the said band pass filters as frequency tuning elements. It should also be noted that the present invention is not inherently limited in application to oscillators operating at microwave frequencies such as the case with the preferred embodiment of FIG. 1. The invention also is readily adaptable to lower frequency oscillator structures.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A saturable multi-mode oscillator comprising
a regenerative oscillatory loop,
a source of noise signals within said loop,
said loop being characterized by a build-up time for signals which are delayed substantially an integral number of wavelengths in traversing said loop and being further characterized by a decay time for signals which are delayed substantially a non-integral number of wavelengths in traversing said loop,
and means within said loop for recurrently changing the electrical length of said loop from one value to another at a rate whereby said electrical length remains substantially fixed for a time less than said build-up time at any one frequency and reverts to the same electrical length within said decay time.

2. A saturable multi-mode oscillator comprising
a regenerative oscillatory loop,
a source of continuous noise signals within said loop,
said loop being characterized by a build-up time for signals which are delayed substantially an integral number of wavelengths in traversing said loop and being further characterized by a decay time for signals which are delayed substantially a non-integral number of wavelengths in traversing said loop,
and phase shifting means within said loop for recurrently changing the electrical length of said loop from one value to another at a rate whereby said electrical length remains substantially fixed for a time less than said build-up time at any one frequency and reverts to the same electrical length within said decay time.

3. A saturable multi-mode oscillator comprising
a regenerative oscillatory loop,
a source of continuous noise signals within said loop,
a bandpass filter connected in tandem with said source within said loop,
said loop being characterized by a build-up time for signals which are delayed substantially an integral number of wavelengths in traversing said loop and being further characterized by a decay time for said signals which are delayed substantially a non-integral number of wavelengths in traversing said loop,
and means within said loop for recurrently changing the electrical length of said loop from one value to another at a rate whereby said electrical length remains substantially fixed for a time less than said biuld-up time at any one frequency and reverts to the same electrical length within said decay time.

4. A saturable multi-mode oscillator comprising
a regenerative oscillatory loop,
a source of continuous noise signals within said loop,
said loop being characterized by a build-up time for signals which are delayed substantially an integral number of wavelengths in traversing said loop and being further characterized by a decay time for signals which are delayed substantially a non-integral number of wavelengths in traversing said loop,
actuable means connected in tandem with said source within said loop for recurrently changing the electrical length of said loop from one value to another,
and means for actuating said actuable means at a rate whereby said electrical length remains substantially fixed for a time less than the build-up time at any one frequency and reverts to the same electrical length within said decay time.

5. A saturable multi-mode oscillator comprising
a phase shifter,
a broad band travelling wave tube amplifier connected in tandem with said phase shifter,
means coupled across the tandem-connected phase shifter and amplifier to form a closed regenerative oscillatory loop,
said loop being characterized by a build-up time for signals which are delayed substantially an integral number of wavelengths and being further characterized by a decay time for signals which are delayed substantially a non-integral number of wavelengths in traversing said loop,
and means for actuating said phase shifter for recurrently changing the electrical length of said loop from one value to another whereby said electrical length remains substantially fixed for a time less than said build up time at any one frequency and reverts to the same electrical length within said decay time.

6. An oscillator as defined in claim 5 wherein said means coupled across the tandem-connected phase shifter and amplifier is a bandpass filter tuned to pass a portion of the over-all signal spectrum in which said amplifier is operative.

7. A saturable multi-mode oscillator comprising
an actuable phase shifter,
a broad band travelling wave tube amplifier connected in tandem with said phase shifter,
a plurality of feedback channels coupled across the tandem-connected phase shifter and amplifier to form a plurality of regenerative oscillatory loops,
each said loop being characterized by a build-up time for signals which are delayed substantially an integral number of wavelengths in traversing said loop and being further characterized by a decay time for signals which are delayed substantially a non-integral number of wavelengths in traversing said loop,
and means for actuating said phase shifter for recurrently changing the electrical length of each said loop at a rate whereby said electrical length remains substantially fixed for a time less than said build-up time at any one frequency and reverts to the same electrical length within said decay time.

8. An oscillator as defined in claim 7 wherein each of said feedback channels includes a bandpass filter tuned to pass a respective portion of the over-all signal spectrum within which said amplifier is operative.

References Cited by the Examiner

UNITED STATES PATENTS

| | | | |
|---|---|---|---|
| 2,593,113 | 4/52 | Cutler | 328—155 |
| 3,048,794 | 8/62 | Ares | 331—78 |

ROY LAKE, *Primary Examiner.*

JOHN KOMINDKI, *Examiner.*